(12) United States Patent
Fugerer et al.

(10) Patent No.: US 8,220,977 B2
(45) Date of Patent: Jul. 17, 2012

(54) SOLID STATE LIGHT UNIT AND HEAT SINK, AND METHOD FOR THERMAL MANAGEMENT OF A SOLID STATE LIGHT UNIT

(75) Inventors: Robert Fugerer, Lutz, FL (US); Carl Smith, III, Osprey, FL (US); Lisa Marie Fitzgerald, Sarasota, FL (US)

(73) Assignee: Sunovia Energy Technologies, Inc., Sarasota, FL (US)

( * ) Notice: Subject to any disclaimer, the term of this patent is extended or adjusted under 35 U.S.C. 154(b) by 0 days.

(21) Appl. No.: 12/685,571

(22) Filed: Jan. 11, 2010

(65) Prior Publication Data
US 2010/0315813 A1   Dec. 16, 2010

Related U.S. Application Data

(63) Continuation of application No. PCT/US2008/070022, filed on Oct. 1, 2008.

(60) Provisional application No. 60/949,459, filed on Jul. 12, 2007.

(51) Int. Cl.
*F21V 29/00*   (2006.01)

(52) U.S. Cl. .................. 362/373; 362/249.02; 362/249.1

(58) Field of Classification Search ............. 362/249.02, 362/249.11, 373, 294
See application file for complete search history.

(56) References Cited

U.S. PATENT DOCUMENTS

| | | | |
|---|---|---|---|
| 6,682,211 B2 | 1/2004 | English et al. | |
| 7,114,831 B2 * | 10/2006 | Popovich et al. | 362/294 |
| 7,625,104 B2 * | 12/2009 | Zhang et al. | 362/294 |
| 7,674,010 B2 * | 3/2010 | Griffiths et al. | 362/249.02 |
| 7,883,240 B2 * | 2/2011 | Lee et al. | 362/249.02 |
| 2001/0014019 A1 | 8/2001 | Begemann | |
| 2006/0141851 A1 | 6/2006 | Matsui et al. | |
| 2006/0181878 A1 | 8/2006 | Burkholder | |
| 2006/0262545 A1 | 11/2006 | Piepgras et al. | |
| 2008/0106892 A1 * | 5/2008 | Griffiths et al. | 362/223 |
| 2009/0097249 A1 * | 4/2009 | Lee et al. | 362/249.02 |

OTHER PUBLICATIONS

International Searching Authority, "Notification of Transmittal of the International Search Report and the Written Opinion of the International Searching Authority, or the Declaration," Nov. 10, 2008.

* cited by examiner

*Primary Examiner* — Anabel Ton
(74) *Attorney, Agent, or Firm* — Holland & Hart LLP

(57) ABSTRACT

A lamp assembly manages thermal energy output from solid state lighting elements. An aspect of the present disclosure provides a lamp assembly that achieves enhanced cooling of light elements within the assembly. Enhanced cooling is achieved, in this aspect, by providing a lamp assembly including a heat sink having a plurality of thermo bosses protruding therefrom on a first side, and a plurality of heat sink fins on a second side. A printed circuit board is secured to the first side of the heat sink, and has a plurality of through holes that correspond to the size and locations of the thermo bosses, such that when the printed circuit board is secured to the heat sink, the thermo bosses extend into the through holes.

11 Claims, 8 Drawing Sheets

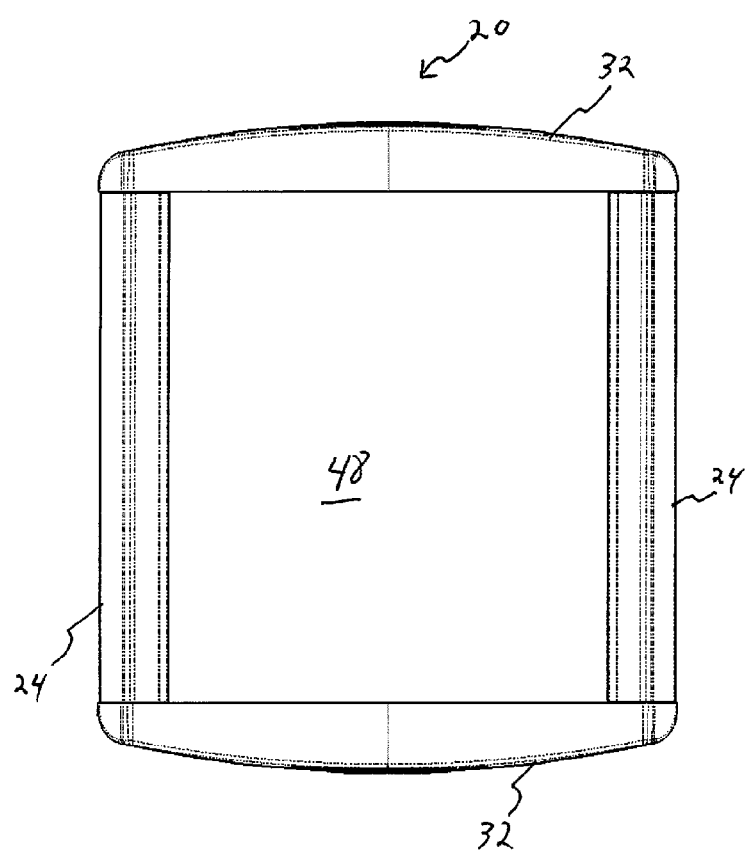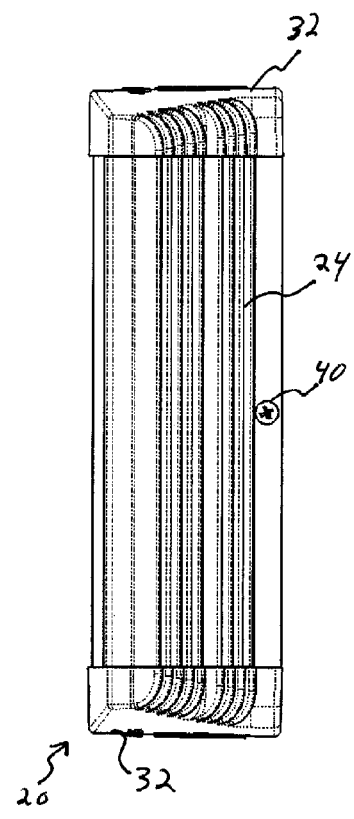
Figure 4
Figure 5

SOLID STATE LIGHT UNIT AND HEAT SINK, AND METHOD FOR THERMAL MANAGEMENT OF A SOLID STATE LIGHT UNIT

CROSS REFERENCE TO RELATED APPLICATIONS

The present application claims priority from U.S. Provisional Patent Application No. 60/949,459, filed on Jul. 12, 2007, and is a continuation of International Patent Application No. PCT/US08/70022 filed 10/01/2008, the entire disclosures of which are incorporated herein by reference in their entirety.

FIELD

The present disclosure relates to solid state light units, and more specifically, to an LED-based light unit with a heat sink adapted to dissipate heat generated from LED elements.

BACKGROUND

Lighting systems traditionally use various different types of illumination devices, commonly including incandescent lights, fluorescent lights, and, increasingly, solid state illumination devices such as Light Emitting Diode (LED) based lights. LED based lights generally rely on multiple diode elements to produce sufficient light for the needs of the particular light or lighting system. As an approach to offset increasing energy prices and make a meaningful indent to the production of greenhouse gases, solid state lighting offers great promise in this regard. With efficacies approaching 150 lumens per Watt, and lifetimes at over 50,000 Hours, LEDs and lighting products based on LED technology may potentially make significant inroads in the lighting market in residential and commercial, indoor and outdoor applications.

LED based lights offer significant advantages in efficiency and longevity compared to, for example, incandescent sources, and produce less waste heat than many other types of lighting. For example, if perfect solid-state lighting devices were to be fabricated, the same level of luminance can be achieved by using merely ½₀ of the energy that an equivalent incandescent lighting source requires. LEDs offer greater life than many other lighting sources, such as incandescent lights and compact fluorescents, and contain no environmentally harmful mercury that is present in fluorescent type lights. LED based lights also offer the advantage of instant-on and are not degraded by repeated on-off cycling. Furthermore, LED based lights can withstand more extreme environmental conditions than many other types of lighting products, such as relatively high and low operating temperatures and/or applications having frequent shock or vibration.

As mentioned above, LED based lights generally rely on multiple LED elements to generate light. An LED element, as is well known in the art, is a small area light source, often with associated optics that shape the radiation pattern and assist in reflection of the output of the LED. LEDs are often used as small indicator lights on electronic devices and increasingly in higher power applications such as flashlights and area lighting. The color of the emitted light depends on the composition and condition of the semiconducting material used to form the junction of the LED, and can be infrared, visible, or ultraviolet.

Within the visible spectrum, LEDs can be fabricated to produce desired colors. For applications where the LED is to be used in area lighting, a white light output is typically desirable. There are two common ways of producing high intensity white-light LED. One is to first produce individual LEDs that emit three primary colors (red, green, and blue), and then mix all the colors to produce white light. Such products are commonly referred to as multi-colored white LEDs, and sometimes referred to as RGB LEDs. Such multi-colored LEDs generally require sophisticated electro-optical design to control the blend and diffusion of different colors, and this approach has rarely been used to mass produce white LEDs in the industry to date. In principle, this mechanism has a relatively high quantum efficiency in producing white light.

A second method of producing white LED output is to fabricate a LED of one color, such as a blue LED made of InGaN, and coating the LED with a phosphor coating of a different color to produce white light. One common method to produce such and LED-based lighting element is to encapsulate InGaN blue LEDs inside of a phosphor coated epoxy. A common yellow phosphor material is cerium-doped yttrium aluminum garnet ($Ce3+:YAG$). Depending on the color of the original LED, phosphors of different colors can also be employed. LEDs fabricated using such techniques are generally referred to as phosphor based white LEDs. Although less costly to manufacture than multi-colored LEDs, phosphor based LEDs have a lower quantum efficiency relative to multi-colored LEDs. Phosphor based LEDs also have phosphor-related degradation issues, in which the output of the LED will degrade over time. Although the phosphor based white LEDs are relatively easier to manufacture, such LEDs are affected by Stokes energy loss, a loss that occurs when shorter wavelength photons (e.g., blue photons) are converted to longer wavelength photons (e.g. white photons). As such, it is often desirable to reduce the amount of phosphor used in such applications, to thereby reduce this energy loss. As a result, LED-based white lights that employ LED elements with such reduced phosphor commonly have a blue color when viewed by an observer.

Various other types of solid state lighting elements may also be used in various lighting applications. Quantum Dots, for example, are semiconductor nanocrystals that possess unique optical properties. The emission color of quantum dots can be tuned from the visible throughout the infrared spectrum. This allows quantum dot LEDs to create almost any output color. Organic light-emitting diodes (OLEDs) include an emitting layer material that is an organic compound. To function as a semiconductor, the organic emitting material must have conjugated pi bonds. The emitting material can be a small organic molecule in a crystalline phase, or a polymer. Polymer materials can be flexible; such LEDs are known as PLEDs or FLEDs.

SUMMARY

The present disclosure provides a lamp assembly that manages thermal energy output from solid state lighting elements. An aspect of the present disclosure provides a lamp assembly that achieves enhanced cooling of light elements within the assembly. Enhanced cooling is achieved, in this aspect, by providing a lamp assembly including a heat sink having a plurality of thermo bosses protruding therefrom on a first side, and a plurality of heat sink fins on a second side. A printed circuit board is secured to the first side of the heat sink, and has a plurality of through holes that correspond to the size and locations of the thermo bosses, such that when the printed circuit board is secured to the heat sink, the thermo bosses extend into the through holes.

Light elements are mounted to the printed circuit board such that the through holes are located beneath a substantial portion of the surface area of the light element, thereby allowing the thermo bosses to contact the back side of the light elements to provide an enhanced thermal conductive path between the light elements and the heat sink. The printed circuit board, in one embodiment, is secured to the heat sink by a retaining spring that presses against a ring on one or more LED light elements, and enhanced the contact between the back side of the LED element and the corresponding thermo boss.

A reflective surface may be in place on the opposite side of the retaining spring that may reflect light to a lens of the light assembly. A power supply may be attached to the housing, and provides power to the PCB and light elements. Such a power supply may be interconnected to an external power supply, and/or may have an internal battery or other power supply that is used to provide power to the PCB and light elements.

In another aspect, the present disclosure provides a method for managing thermal output of a solid state lamp assembly. In an exemplary embodiment, steps for thermal management include providing a mounting substrate with one or more through holes corresponding to location(s) where solid state light element(s) are mounted to the substrate. A heat sink assembly is coupled to the mounting substrate such that bosses that protract from the heat sink extend into the through hole(s) of the mounting substrate and contact a portion of the solid state light element(s). In one embodiment, the method also includes securing the heat sink to the mounting substrate with a retaining spring. In other embodiments, the method may also include interconnecting optical elements with the lamp assembly, such as reflectors, lenses, and/or diffusers.

BRIEF DESCRIPTION OF THE DRAWINGS

FIG. 4 is a bottom plan view of a solid state lamp of an exemplary embodiment of the present disclosure;

FIG. 5 is a side plan view of a solid state lamp of an exemplary embodiment of the present disclosure;

DETAILED DESCRIPTION

The present disclosure recognizes that providing solid state lamp assemblies, such as LED lamps, is desirable in many situations, and that the presence of multiple LEDs in an assembly can result in heating issues related to LED operation. Such problems have been addressed in the past by using printed circuit boards (PCBs) with metal cores, with an LED mounted to the PCB, and the metal core helping dissipate heat generated from the LED. Such PCBs are relatively expensive, and may still have heating issues related to heat generated from LEDs. The present disclosure provides a thermal path for heat generated by solid state light elements to be dissipated in an efficient manner using a thermo boss interconnected to a heat sink, which contacts at least a portion of the solid state lighting element. The solid state light element is interconnected to a circuit board that includes a through hole aligned to the thermo boss. The heat sink may include fins that radiate heat into ambient air exterior of the lamp assembly.

Figure 1:
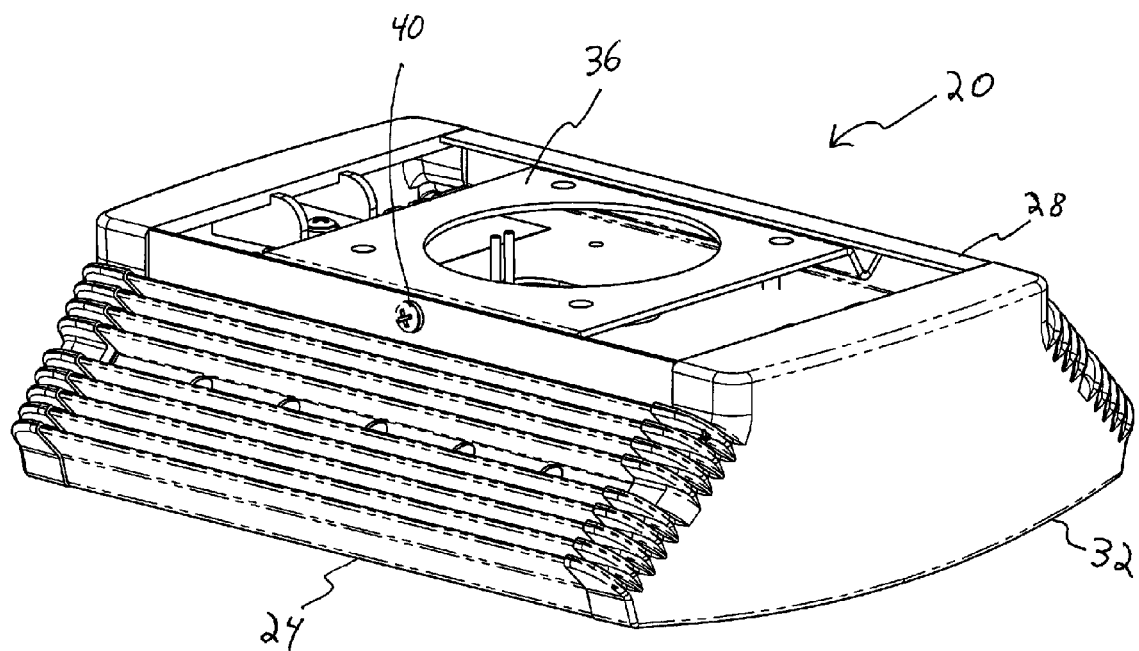
FIG. 1 is a perspective view of a solid state lamp of an exemplary embodiment of the present disclosure.
Figure 2:
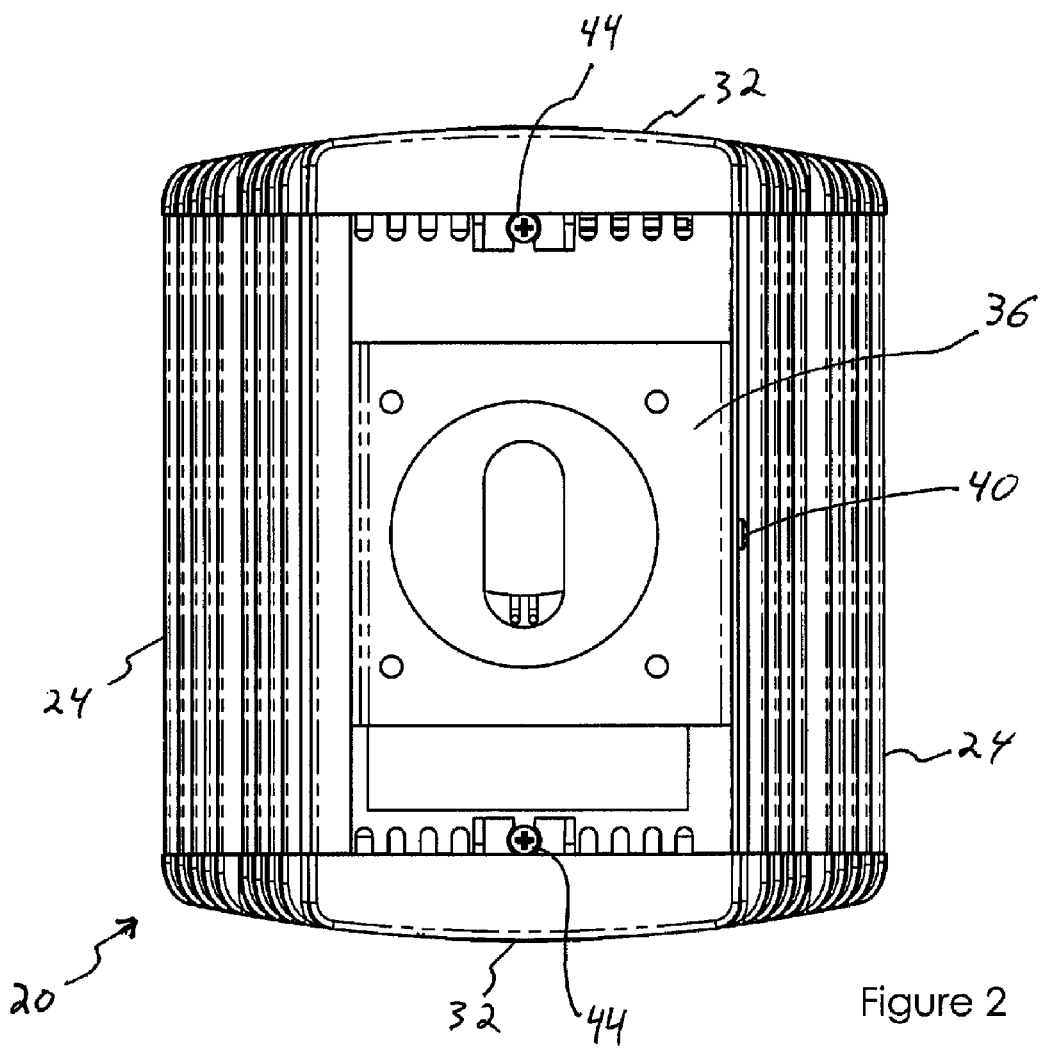
FIG. 2 is a top plan view of a solid state lamp of an exemplary embodiment of the present disclosure.
Figure 3:
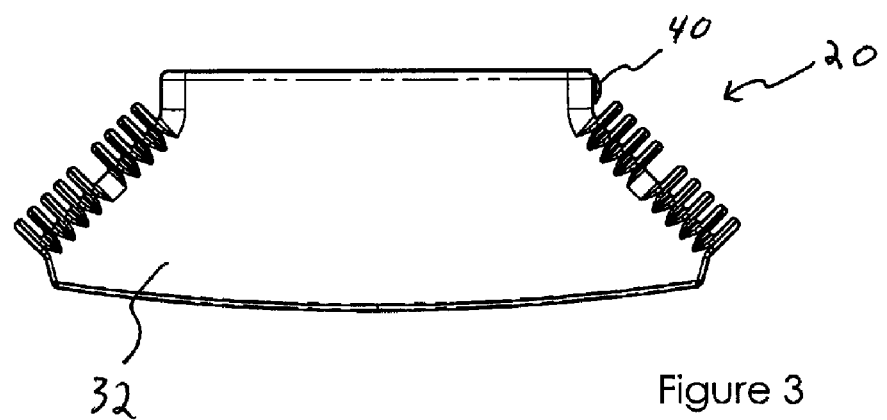
FIG. 3 is an end plan view of a solid state lamp of an exemplary embodiment of the present disclosure.

FIGS. 1 through 14 illustrate various embodiments of a lamp assembly. With reference first to FIGS. 1-3, and 8, a lamp assembly 20 of an exemplary embodiment is described. FIG. 1 is a perspective view of the lamp assembly 20, FIG. 2 is a top plan view, FIG. 3 is an end plan view, and FIG. 8 is an exploded view of the lamp assembly 20 illustrating various components that are included in the lamp assembly 20 of this embodiment. The lamp assembly 20, as illustrated, comprises a housing 28 that includes heat sink elements. 24 on each side of the housing 28, and between flanges 34 on each end of the housing 28. Heat sink 24 may be further secured by to the housing 28 with a heat sink retainer screw 40 extending through screw aperture 140 and into a screw slot formed into heat sink 24. The heat sinks 24, in this embodiment, include a heat dissipating surface that includes heat dissipating fins and a heat collecting surface that includes a number of thermo bosses that protrude from the heat sink 24. Fins and thermo bosses of heat sinks 24 of this embodiment are described in more detail below. As best illustrated in FIG. 8, end caps 32 are attached to flanges 152 on housing 28 by retainer tabs 120 clipping through retainer tab slots 124. End caps 32 may further secured by end cap retainer screw 44 through a screw aperture on the housing 28. With reference to FIGS. 4 and 5, the lamp assembly 20 includes a lens 48 that is secured to the lamp assembly 20. Solid state light elements, such as Light Emitting Diodes (LEDs) are located in the interior of the housing 28, and, when illuminated, provide light through the lens 48. Lens 48 may include optics that act to diffract, diffuse, or focus the light from the light elements.

Figure 6:
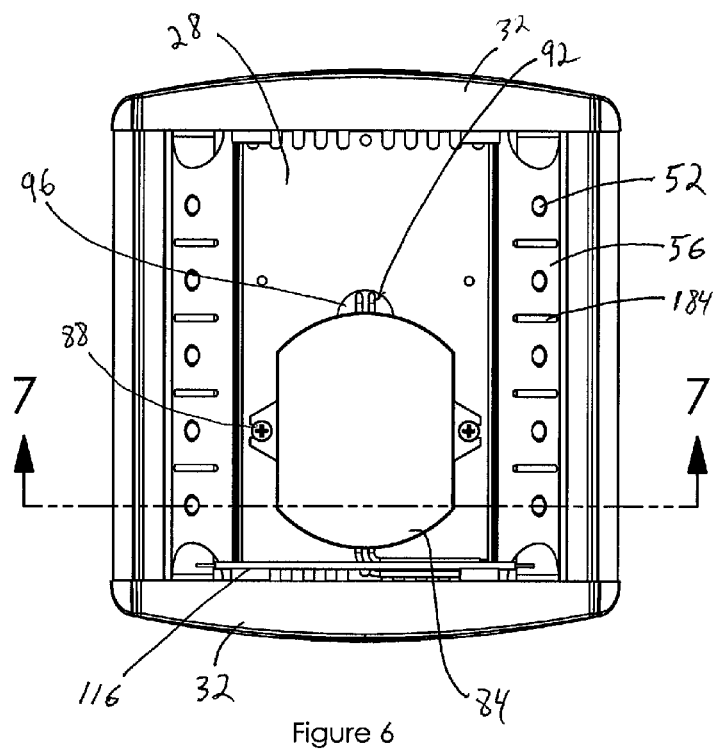
FIG. 6 is a bottom plan view of a solid state lamp of an exemplary embodiment of the present disclosure that a lens element removed.
Figure 7:
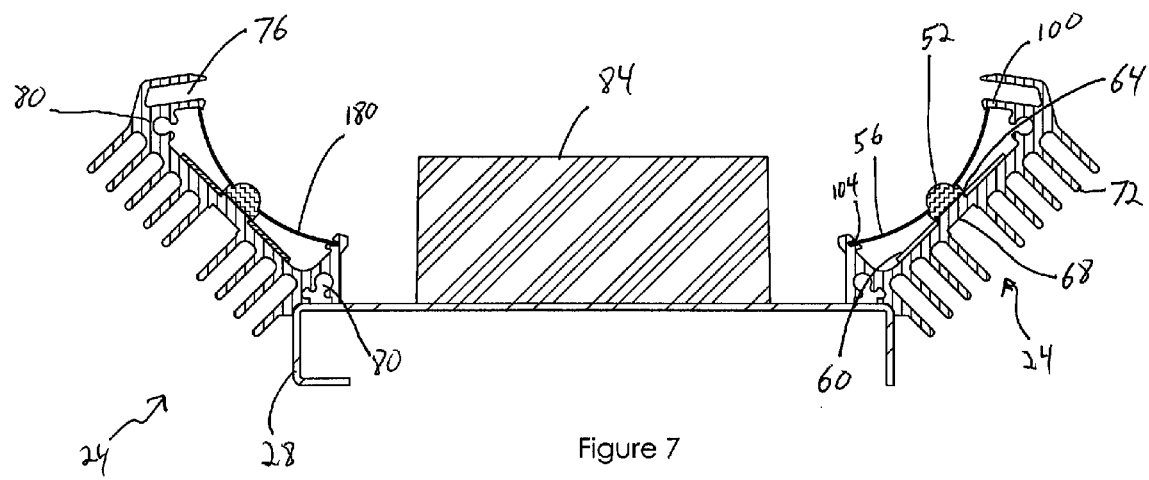
FIG. 7 is a cross-sectional view of a solid state lamp of the embodiment of FIG. 6 along the section 7-7.
Figure 8:
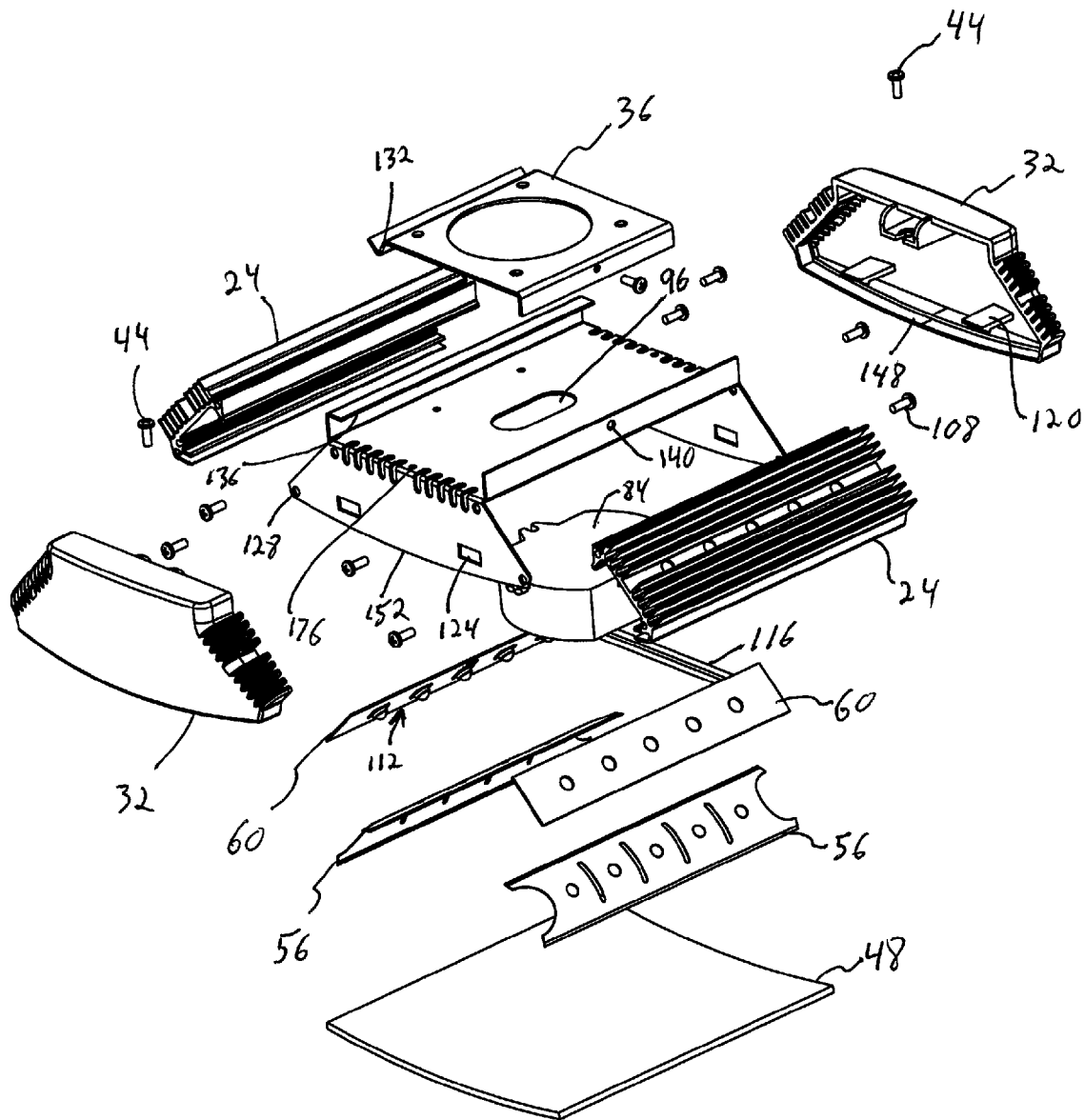
FIG. 8 is an exploded view of a solid state lamp of an exemplary embodiment of the present disclosure.
Figure 9:
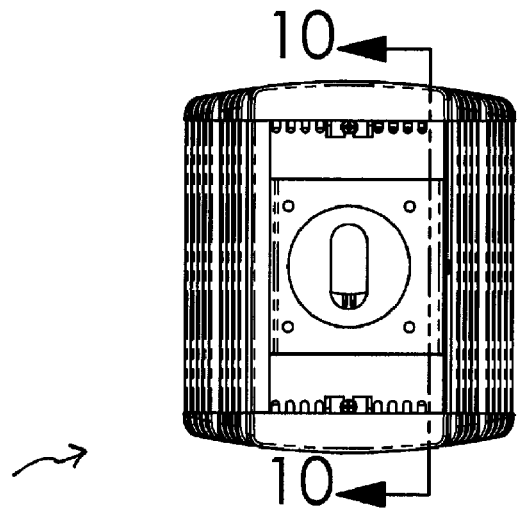
FIG. 9 is a top plan view of a solid state lamp of an exemplary embodiment of the present disclosure.
Figure 10:
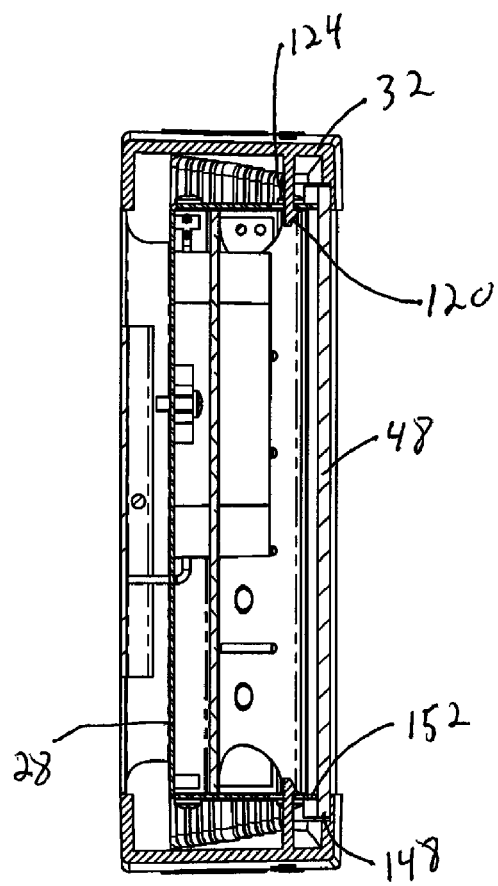
FIG. 10 is a cross-sectional view of a solid state lamp of the embodiment of FIG. 9 along the section 10-10.
Figure 11:
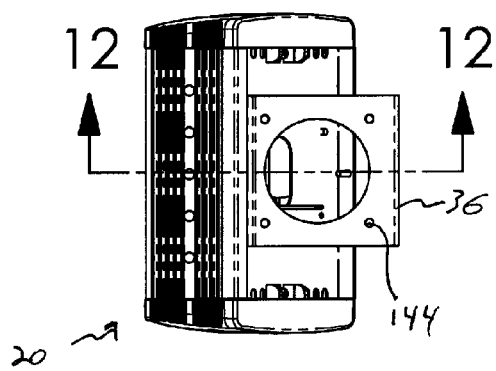
FIG. 11 is a side plan view of a solid state lamp of another exemplary embodiment of the present disclosure.
Figure 12:
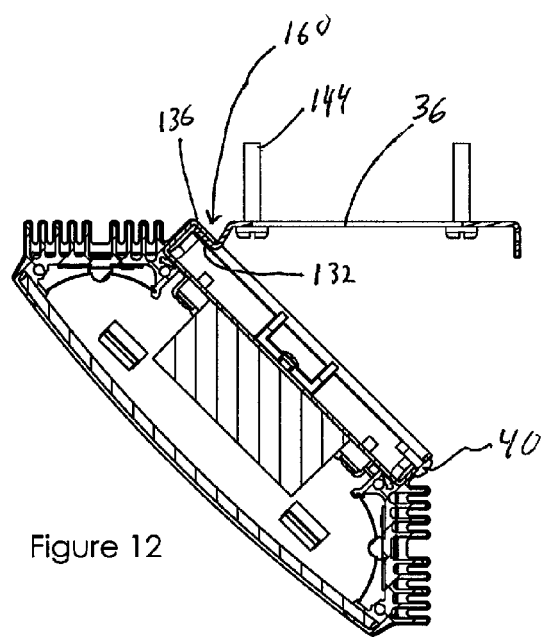
FIG. 12 is a cross-sectional view of a solid state lamp of the embodiment of FIG. 11 along the section 12-12.

Referring to FIGS. 6, 7, and 8, solid state light elements and associated components located on the interior of the housing 28 are now discussed for this exemplary embodiment. Included, in this embodiment, is a printed circuit assemblies 112 (best illustrated in FIG. 8) comprised of printed circuit boards 60 and a plurality of light emitting diodes 52. The printed circuit boards 60 are attached to heat sinks 24 by means of retaining springs 56 and 180 that are interconnected with the heat sinks 24 and assert pressure against a rings 64 on light emitting diodes 52. The printed circuit boards 60 include through holes that are aligned adjacent to the light emitting diodes 52. In this embodiment, the light emitting diodes 52 are interconnected with metal interconnect traces (not shown) on the printed circuit boards that are adjacent to the through holes in the printed circuit boards 60. The heat sinks 24, in this embodiment, include thermo bosses 68 that, when aligned with the through holes on the printed circuit boards 60, extend at least partially into the through holes of the printed circuit boards. When retaining springs 56, 180, are interconnected to the heat sinks 24, pressure is applied against the LEDs 52 and printed circuit boards 60 to place a bottom side of each LED 52 into contact with an associated thermo boss 68 on the heat sinks 24. In this manner, the assembly forms a thermal path from light emitting diodes 52 through thermo bosses 68 to the heat sinks 24. Heat generated through the operation of light emitting diode 52 is conducted through this path and continuing to a plurality of heat sink fins 72 formed on the heat sinks 24. The fins 72 provide surface area for natural convection to dissipate the heat load generated from the operation of the LEDs 52. Retaining springs 56, 180, are held in bias by retainer slot 100 on the proximal side and retainer notch 104 on the distal side. Relief slots 184 may be includes that allow mechanical force to normalize across retaining springs 56, 180, for each light emitting diode 52. A reflective surface may be included on the side of retaining springs 56, 180, interior to the lamp assembly to reflect back scatter from rear surface of lens 48 and any light from LEDs 52, onto on lens 48.

With continuing reference to FIGS. 6-8, a power supply 84 is attached to housing 28, in this embodiment, by power supply retaining screws. Power supply 84 provides power to the printed circuit boards 60 and light emitting diodes 52. A positive and negative interconnect wire provides power to each of printed circuit boards assembly 112. Power from an outside source is attached to power supply 84 through power supply input wires 92 routed through input wiring aperture 96 in housing 28 to an outside power source. Outside power source may be any suitable power source, such as commonly available residential, commercial, and industrial alternating current power, and/or direct current power.

Referring now to FIGS. 4, 7 and 9-10, lens 48, in this embodiment, is held in lamp assembly 20 by means of lens slot 76 and is captured longitudinally by end caps 32 on each end. Lens 48 is captured and a curve is formed in lens 48 through a curved retainer surface 148 and the curved surface of flanges 152. The curving of lens 48 provides additional mechanical strength to the lamp assembly 20 and improves light scatter for light that is emitted through the lens.

Figure 13:
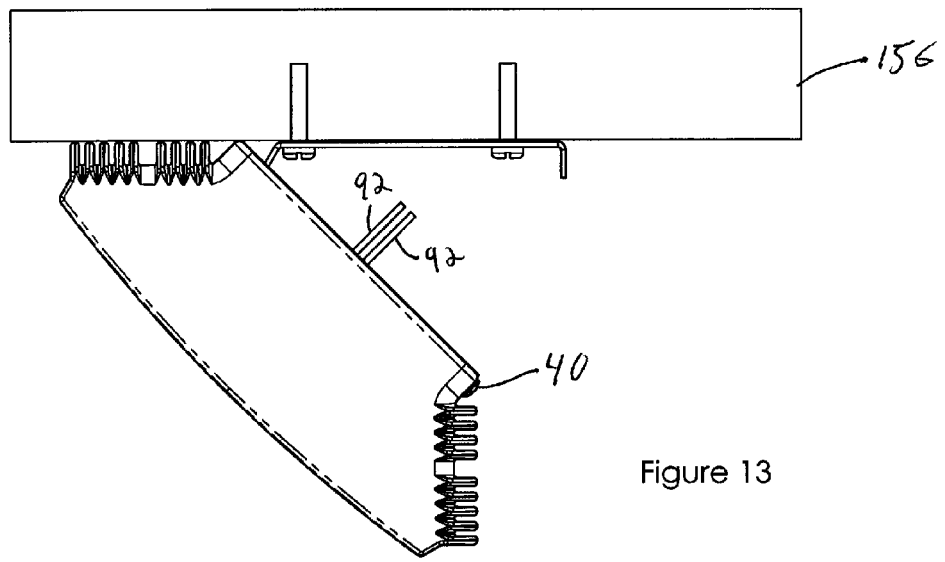
FIG. 13 is an end plan view of a solid state lamp of the embodiment of FIG. 11.

Referring to FIGS. 1, 2, 5, 8 and 11-13, interface bracket 36 provides a point to attach lamp assembly 20 to a mounting surface 156 through a plurality of interface bracket screws 144. A hinge 160 is formed by catch surface 136 on housing 28 and angled surface 132 interface bracket 36. Referring to FIG. 13, this hinge allows the lamp to hang from the mounting surface 156 at an angle, after interface bracket 36 is mounted, for ease of wiring power supply input wires 92. Lamp assembly 20 is secured to interface bracket 36 by retainer screws 40, as previously discussed, through retainer screw aperture 140 on housing 28.

Figure 14:
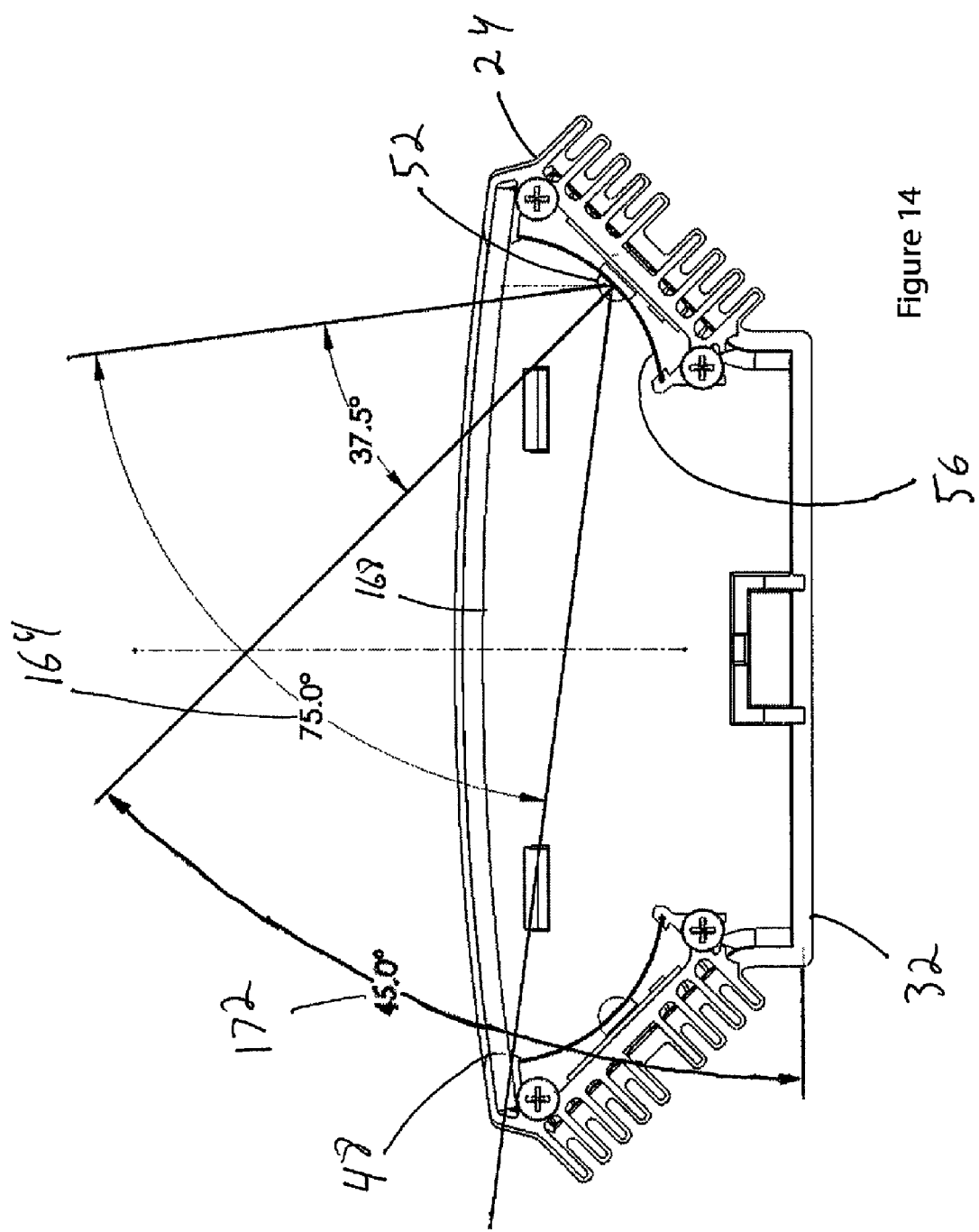
FIG. 14 is an cross-sectional view of a solid state lamp illustrating exemplary ray paths for an embodiment of the present disclosure.

With reference now to FIG. 14, a lamp angles for a lamp assembly 20 of an embodiment are now described. In this embodiment, a lamp angle 172 of 45 degrees allows an elliptical footprint of light energy across lens 48 rear surface using a typical light dispersion angle 164 of 75 degrees. This elliptical pattern when in conjunction with the plurality of light emitting diodes 52 forms a consistent bright illumination on lens 48.

It will be appreciated that, while embodiments of the present disclosure have been illustrated with respect to FIGS. 1-14, other embodiments may include fewer, additional, or alternate, components. For example, the lamp assembly may include one or more sensors that determine when an amount of ambient light is below a threshold level, and cause the lamp assembly to power on and provide light. Various embodiments may include one or more controllers, such as a microprocessor or other integrated circuit, that control the output of the lamp assembly and may, for example, cause fewer than all of the LEDs to illuminate based on a set of predefined criteria, such as ambient available light, power input to the lamp assembly (such as through a dimmer switch), or any other of various conditions. Furthermore, the present disclosure provides a method for managing the thermal management of a solid state lamp assembly. Such a method includes providing one or more light elements, a printed circuit board having a plurality of through holes, and a heat sink having a plurality of thermo bosses that are aligned to the through holes when the printed circuit board is placed adjacent to the heat sink. Light elements are mounted to the printed circuit board such that at least a portion of one or more of the light elements cover a through hole. The printed circuit board with attached light elements is placed adjacent to the heat sink such that the thermo bosses of the heat sink extend through the through holes and contact at least a portion of one or more of the light elements. A biasing member may be placed against the printed circuit board and/or light elements to provide pressure against the printed circuit board and/or light elements and place light elements in firm contact with an associated thermo boss. In embodiments where the lamp assembly includes a controller, temperature of the lamp assembly may be monitored and one or more of the light elements may be cycled on and off to reduce the heat generated by the assembly.

While the instant disclosure has been depicted, described, and is defined by reference to particular exemplary embodiments of the disclosure, such references do not imply a limitation on the disclosure, and no such limitation is to be inferred. The embodiments recited in this disclosure are capable of considerable modification, alteration, and equivalents in form and function, as will occur to those ordinarily skilled in the pertinent arts. The depicted and described embodiments are examples only, and are not exhaustive of the scope of the invention.

It will be understood by those within the art that each operation and/or component described and/or illustrated herein may be implemented, individually and/or collectively, by a wide range of hardware, software, firmware, or any combination thereof. The foregoing disclosure also describes embodiments including components contained within other components. Such architectures are merely examples, and many other architectures can be implemented to achieve the same functionality.

What is claimed is:

1. A solid state lamp assembly comprising:
    a heat sink comprising a heat dissipating surface and a heat collecting surface, the heat collecting surface having one or more thermo bosses protruding therefrom;
    a printed circuit board having at least one through hole and a light element mounting area located adjacent to the through hole, the printed circuit board mounted in the lamp assembly adjacent to the heat sink such that the thermo boss extends into the through hole;
    at least one solid state light element mounted to the printed circuit board at the mounting area, at least a portion of the solid state light element covering the through hole such that the solid state light element contacts the thermo boss; and
    a retaining spring that presses against a ring formed on one or more solid state light elements and enhances the contact between the back side of the solid state light element and the thermo boss.

2. The lamp assembly of claim 1, further comprising a biasing member interconnected to the heat sink with the printed circuit board located between the biasing member and the heat sink, whereby the biasing member asserts pressure against the printed circuit board to pressure the solid state light element against the thermo boss.

3. The lamp assembly of claim 2, wherein the biasing member comprises a spring that is secured to the lamp assembly and provides pressure along a length of the printed circuit board against the heat sink.

4. The lamp assembly of claim 2, wherein the biasing member substantially surrounds the solid state light element.

5. The lamp assembly of claim 1, further comprising a lens interconnected with the heat sink and printed circuit board that scatters light produced by the solid state light elements.

6. The lamp assembly of claim 1, further comprising a mounting bracket that is interconnected with the heat sink and printed circuit board providing a mounting point for the lamp assembly.

7. The lamp assembly of claim 6, wherein the mounting bracket interconnects with a flange on the heat sink to provide a hinge that holds the lamp assembly at a convenient angle for interconnecting a power supply of the lamp assembly to a power source.

8. The lamp assembly of claim 1, wherein the retaining spring comprises a reflective surface on the opposite side of the retaining spring that reflects light to a lens of the lamp assembly.

9. The lamp assembly of claim 1, wherein the heat sink, printed circuit board, and light element are mounted to a housing, and further comprising a power supply attached to the housing that provides power to the printed circuit board and light elements.

10. The lamp assembly of claim 9, wherein the power supply is interconnected to an external power supply and has an internal battery or other power supply that is used to provide power to the PCB and light element in the event that the external power supply is not available.

11. The lamp assembly of claim 1, wherein the at least one solid state light element comprises a light emitting diode.

* * * * *